(12) United States Patent
Takei

(10) Patent No.: US 7,863,151 B2
(45) Date of Patent: Jan. 4, 2011

(54) METHOD FOR MANUFACTURING SEMICONDUCTOR DEVICE

(75) Inventor: Manabu Takei, Shiojiri (JP)

(73) Assignee: Fuji Electric Systems Co., Ltd. (JP)

( * ) Notice: Subject to any disclaimer, the term of this patent is extended or adjusted under 35 U.S.C. 154(b) by 17 days.

(21) Appl. No.: 12/489,884

(22) Filed: Jun. 23, 2009

(65) Prior Publication Data
US 2009/0317959 A1 Dec. 24, 2009

(30) Foreign Application Priority Data
Jun. 23, 2008 (JP) .............................. 2008-163408

(51) Int. Cl.
*H01L 21/76* (2006.01)
(52) U.S. Cl. .................. 438/429; 438/700; 438/710; 438/720; 438/719; 438/296; 257/513; 257/327; 257/E21.09; 257/E21.238; 257/E21.258
(58) Field of Classification Search .............. 438/429, 438/700, 710, 720, 719, 296; 257/513, 327; 257/E21.09, E21.238, E21.258
See application file for complete search history.

(56) References Cited

U.S. PATENT DOCUMENTS 7,402,522 B2 * 7/2008 Hsieh et al. ................ 438/700

2005/0221547 A1 10/2005 Yamauchi et al.
2007/0072398 A1 3/2007 Shibata et al.

FOREIGN PATENT DOCUMENTS

| JP | 2005-317905 A | 11/2005 |
| JP | 2007-096137 A | 4/2007 |
| JP | 2007-201499 A | 8/2007 |

* cited by examiner

*Primary Examiner*—Jarrett J Stark
*Assistant Examiner*—Wilner Jean Baptiste
(74) *Attorney, Agent, or Firm*—Rossi, Kimms & McDowell LLP

(57) ABSTRACT

A manufacturing method for manufacturing a super-junction semiconductor device forms an oxide film and a nitride film on an n-type epitaxial layer exhibiting high resistance on an n-type semiconductor substrate exhibiting low resistance. The portion of the nitride film in the scribe region is left unremoved by patterning and an alignment marker is opened through the nitride film. After opening a trench pattern in the oxide film, trenches having a high aspect ratio are formed. The portion of the oxide film outside the scribe region is removed and a p-type epitaxial layer is buried in the trenches. The overgrown p-type epitaxial layer is polished with reference to the nitride film, the polished surface is finished by etching, and the n-type epitaxial layer surface is exposed.

7 Claims, 5 Drawing Sheets

METHOD FOR MANUFACTURING SEMICONDUCTOR DEVICE

BACKGROUND

The present invention relates to a method for manufacturing a semiconductor device. Specifically, the invention relates to a method for manufacturing a power super-junction semiconductor device (hereinafter referred to as an "SJ-MOSFET").

MOSFET's that break the conventional characteristics limits have been proposed. The MOSFET's include an alternating conductivity type layer that constitutes a drift layer on the major surface of a heavily doped semiconductor substrate (or a semiconductor substrate exhibiting low electrical resistance). The alternating conductivity type layer is an aggregate having the so-called "super-junction structure" formed of columnar p-type regions and columnar n-type regions. The columnar p-type regions and columnar n-type regions are formed in perpendicular to the major surface of the semiconductor substrate. The columnar p-type regions and columnar n-type regions are arranged in close contact with each other and alternately in parallel to the major surface of the semiconductor substrate. Hereinafter, the super-junction structure as described above will be referred to sometimes as the "p- and n-type columnar structure" or the "SJ columnar structure".

MOSFET's having the super-junction structure manufactured by the multi-step epitaxial growth method have been mass-produced already. The multi-step epitaxial growth method grows epitaxial layers, which constitute a drift layer on a semiconductor substrate exhibiting low resistance, layer by layer. In every stage of growing an epitaxial layer, patterning and ion implantation for forming p-type regions and patterning and ion implantation for forming n-type regions are conducted. And, the growth of an epitaxial layer and the patterning and ion implantation for forming p-type regions and n-type regions are repeated to laminate the epitaxial layers and to grow the p-type regions and n-type regions in perpendicular to the substrate major surface.

The multi-step epitaxial growth method preferably aggregates the p-type regions and n-type regions formed in perpendicular to the substrate major surface such that the p-type regions and n-type regions are in close contact with each other and arranged alternately along the substrate major surface. The multi-step epitaxial growth method preferably determines the dimensions and structures of the p-type regions and n-type regions suitable for making a current flow in the ON-state of the device and for being depleted in the OFF-state of the device. In short, the multi-step epitaxial growth method is preferable for forming the so-called super junction structure. However, the manufacturing process of the multi-step epitaxial growth method is long and complicated, increasing the manufacturing costs and the chip costs.

Recently, an epitaxial trench filling method, which facilitates manufacturing a super-junction structure similar to the super-junction structure described above and reducing the manufacturing costs, has been developed. The epitaxial trench filling method employs a wafer including a heavily doped n-type semiconductor substrate and an n-type epitaxial layer grown on the heavily doped n-type semiconductor substrate and having a predetermined thickness. The n-type epitaxial layer will work for a drift layer.

An oxide film or such a film that will work for an etching mask is formed on the wafer. Patterning is conducted to form openings in the oxide film at predetermined intervals for forming trenches. Using the remaining portion of the oxide film for a trench etching mask, trenches with a high aspect ratio are formed by reactive ion etching (hereinafter referred to as "RIE") through the n-type epitaxial layer or closely to the boundary between the n-type epitaxial layer and the n-type semiconductor substrate.

Then, a p-type epitaxial layer is grown in the trenches to fill the trenches completely with the p-type epitaxial layer and to form a p- and n-type columnar structure. The manufacturing process of the epitaxial trench filling method is shorter and simpler than the manufacturing process of the multi-step epitaxial growth method. Therefore, the epitaxial trench filling method facilitates reducing the manufacturing costs, with which a super-junction structure is manufactured.

However, when the p-type epitaxial layer is buried in the trenches by the epitaxial trench filling method, the p-type epitaxial layer will grow laterally on the mask oxide film in the final stage of filling the trench with the p-type epitaxial layer, if the mask oxide film is remaining on the wafer surface. The lateral growth of the p-type epitaxial layer (the additionally grown p-type epitaxial layer or the overgrown p-type epitaxial layer) impairs the crystallinity in the growth plane. If the time, for which the p-type epitaxial layer is additionally grown (overgrown), is long, crystal defects caused in the overgrown p-type epitaxial layer grown over the mask oxide will happen to diffuse sometimes to the semiconductor wafer below the mask oxide film. The crystal defects in the semiconductor wafer will remain, even if the overgrown p-type epitaxial layer is removed by surface polishing. The causes of leakage current increase are remaining in the semiconductor wafer, since the crystal defects are remaining in the semiconductor wafer.

It is therefore desirable to finish the epitaxial growth in the state, in which all the trenches are filled with respective silicon layers to the opening surface edges thereof by the epitaxial growth, without forming any overgrown epitaxial layer that causes the crystal defects as described above. However, growth rate variations are caused in every batch of epitaxial growth as well as in every wafer plane. Therefore, it is impossible in practice to finish the epitaxial growth in the state, in which all the trenches in the wafer are filled with the respective epitaxial growth layers without causing any undergrowth or overgrowth. Since the expected device characteristics are not obtained when the trenches are not filled fully with the respective epitaxial layers due to epitaxial-growth-time shortage, the over epitaxial growth step described above is necessary and indispensable for the device manufacture.

For obviating the problems described above, it may be preferable to remove the mask oxide film that causes crystal defects prior to the step of fill the trenches with respective epitaxial growth layers. A method that facilitates removing the mask oxide film prior to filling the trenches with respective epitaxial growth layers has been disclosed. After removing the mask oxide film, the disclosed method fills the trenches with respective epitaxial growth layers employing an alignment marker disposed specially to form a super junction structure. See, for example, Japanese Unexamined Patent Application Publication No. 2005-317905.

A method for preventing voids from being caused and for easily flattening the wafer after the trenches are filled with respective epitaxial layers has been disclosed. The disclosed method laminates epitaxial films grown at a high growth rate. See, for example, Japanese Unexamined Patent Application Publication No. 2007-96137.

A method for manufacturing a super junction structure that fills trenches with an epitaxial film, having a flattened region in the surface thereof after a mask oxide film is removed and an alignment marker highly recognizable, has been disclosed.

See, for example, Japanese Unexamined Patent Application Publication No. 2007-201499.

From the view point of manufacturing a device having a MOS structure, however, it is desirable for the mask oxide film to be remaining due to the reason described below. For forming a MOS structure in the surface portion of p- and n-type columns and for making the MOS structure work, it is necessary to position the MOS structure accurately on p- and n-type columns 2 and 7 as shown in FIG. 6. In order to position the MOS structure accurately on p- and n-type columns 2 and 7, it is necessary to position p-type base region 10 for each cell accurately as the cross sectional view of an SJ-MOS structure shown in FIG. 6 indicates. For accurately arranging p-type base region 10, it is desirable to form a marker, the image thereof is recognizable, in the oxide film prior to forming the p- and n-type columns and to accurately position a photomask on the silicon wafer using the marker in the patterning.

If a patterned oxide film is remaining after the trenches are filled with an epitaxial layer, the marker formed in the oxide film pattern can be recognized and utilized for positioning a photomask in the subsequent step. If the mask oxide film is removed completely and, then, trenches are filled with an epitaxial growth layer, a flat plane formed only of the epitaxial layer will be caused on the wafer surface. If the flat plane of the epitaxial layer is caused, the subsequent photostep will not be conducted accurately, since any pattern that works for a mark does not exit.

When the mask oxide film is removed completely and silicon layers are buried in the respective trenches by epitaxial growth, it is necessary to overgrow the silicon layers after the silicon layers fill the trenches completely to prevent insufficient filling from causing in the wafer plane. Since the epitaxial growth rate varies from an epitaxial growth batch to an epitaxial growth batch, thickness variations will be caused among the overgrown epitaxial layers, even if the epitaxial growth is conducted for the same period. Since it is necessary to remove the p-type overgrown epitaxial layer by polishing after the growth thereof, it is necessary to measure the thickness of the overgrown epitaxial layer on every wafer in order to determine the polishing amount.

However, it is difficult to measure the overgrown epitaxial layer thickness non-destructively. Moreover, the non-destructive measurement on the overgrown epitaxial layer thickness is expensive. When the p-type overgrown epitaxial layer is polished deeply (in an over-polishing manner) assuming a certain thickness margin for the p-type overgrown epitaxial layer, variations will be caused among the depths of the buried p-type epitaxial layers after the polishing. An increase in a polishing amount increases variations of the polishing amount. The depth variations of the buried p-type epitaxial layers further cause large variations among the breakdown voltages of the devices. Therefore, it is difficult to remove the mask oxide film prior to the step of filling the trench with a silicon layer by the epitaxial growth method.

In view of the foregoing, it would be desirable to obviate the problems described above. It would be also desirable to provide a method for manufacturing a semiconductor device that facilitates preventing crystal defects due to a mask oxide film from being caused in manufacturing a super-junction semiconductor device by the epitaxial trench filling method, for further decreasing the leakage current and controlling the removal of an overgrown epitaxial layer on an SJ columnar structure, and for further confining the breakdown voltage distribution within a narrow range.

SUMMARY OF THE INVENTION

A method for manufacturing a semiconductor device is provided that facilitates preventing crystal defects due to a mask oxide film from being caused in manufacturing a super-junction semiconductor device by the epitaxial trench filling method, decreases the leakage current and controls the removal of an overgrown epitaxial layer on an SJ columnar structure, and further confines the breakdown voltage distribution within a narrow range.

Specifically, a preferred embodiment of the invention includes forming a lightly doped first epitaxial semiconductor layer of a first conductivity type on the first major surface of a heavily doped semiconductor substrate of the first conductivity type. A first mask film is provided for forming a trench on the first major surface and forming a second mask film, made of a material different from the material of the first mask film, in subsequent to forming the first mask film for forming a super-junction structure in the first epitaxial semiconductor layer, the super-junction structure providing a main current path in the ON-state of the semiconductor device, the super-junction structure being depleted in the OFF-state of the semiconductor device, the super-junction structure including a columnar first region of the first conductivity type and a columnar second region of a second conductivity type extending in parallel to the main current path, the first region and the second region being arranged alternately and in adjacent to each other. The portion of the second mask film in a marker region is selectively removed for mask positioning in a scribe region pattern and the portion of the second mask film in the region outside the scribe region pattern. An opening for forming a trench in the first mask film is formed, the trench being necessary for shaping the second region with a column in adjacent to the first region and for arranging the second region and the first region alternately. The trench through the opening is formed by etching using the first mask film for an etching mask, the trench having a high aspect ratio. The portion of the first mask film is removed outside the region covered with the second mask film and burying a second epitaxial semiconductor layer of the second conductivity type in the trench for forming the columnar second region and for further forming the super-junction structure.

The first mask film is preferably a silicon oxide film and second mask film is preferably a silicon nitride film.

The trench having a high aspect ratio is preferably formed through the Bosch process or by the reactive ion etching method using inductively coupled plasma.

The second epitaxial semiconductor layer is preferably buried in the trench such that the trench is filled with the second epitaxial semiconductor layer and, then, the second epitaxial semiconductor layer is chipped for exposing the surface of the first region.

The torque variation of a polishing motor caused by the contact of a polishing pad to the second mask film is preferably detected in exposing the surface of the first region for judging the end of a polishing treatment; and the surface portion of the second epitaxial semiconductor layer is etched for exposing the surface of the first region.

A mask oxide film for forming trenches and, then, a silicon nitride film are grown on a lightly doped n-type epitaxial layer grown on a heavily doped n-type silicon semiconductor substrate. The silicon nitride film in the scribe region is patterned and left unremoved. At the same time, a marker for mask positioning is opened in the scribe region. A trench pattern is opened in the mask oxide film. Then, trenches are formed through the openings formed in the mask oxide film by the etching method that facilitates obtaining a high aspect ratio.

Then, all the portions of the mask oxide film outside the scribe region are removed. Then, a p-type epitaxial layer is buried in the trenches by epitaxial growth. For fully filling all the trenches with the p-type epitaxial layer, it is necessary to deposit the p-type epitaxial layer considering epitaxial growth rate variations so that the p-type epitaxial layer may be bulging out from the opening of each trench. In contrast to the conventional manufacturing method, the mask oxide film is not on the wafer when the p-type epitaxial layer is grown by the manufacturing method according to the invention. Therefore, lateral epitaxial growth is not caused and crystal defects are prevented from causing by the manufacturing method according to the invention.

Then, the overgrown p-type epitaxial layer is removed by polishing. As the polishing pad touches the silicon nitride film in the scribe region and the motor torque changes, the end of polishing is determined accurately by detecting the motor current change. Then, the very thin overgrown p-type epitaxial layer remaining for the thickness of the silicon nitride film and the thickness of the mask oxide film is removed very accurately by etching. As a result, the crystal defects due to the conventional mask oxide film are prevented from causing during the growth of the buried p-type epitaxial layer and the marker for positioning the MOS cell structure accurately on the p- and n-type columns is formed accurately.

In manufacturing a super junction semiconductor device by the epitaxial trench filling method according to the invention, the crystal defects due to the mask oxide film are prevented from causing for reducing the leakage current variations and the overgrown epitaxial layer on the SJ columns is controllably removed for reducing the breakdown voltage variations.

Other features, advantages, aspects, embodiments, etc. of the invention will become apparent to those skilled in the art from the following detailed description of the preferred embodiments of the invention and the accompanying drawings.

BRIEF DESCRIPTION OF THE DRAWINGS

The invention will be described with reference to certain preferred embodiments thereof with reference to the accompanying drawings, wherein.

DETAILED DESCRIPTION OF THE PREFERRED EMBODIMENTS

Although the invention is described below in connection with the preferred embodiment thereof, changes and modifications are obvious to the persons skilled in the art without departing from the true spirit of the invention.

Figure 1A:
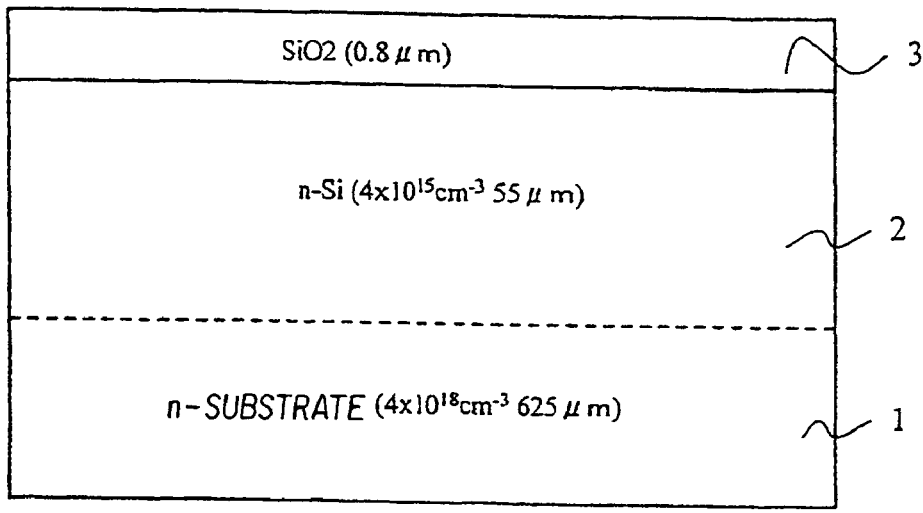
FIG. 1(a) is a cross sectional view describing an initial step for manufacturing an SJ-MOSFET of the 600 V class according to the invention.

FIGS. 1(a) through 1(d) and FIGS. 2(a) through 2(d) are cross sectional views describing the manufacturing steps for manufacturing a semiconductor device according to the invention. Referring at first to FIG. 1(a), a wafer including n-type semiconductor substrate 1 and n-type silicon layer 2 epitaxially grown on n-type semiconductor substrate 1 is prepared. N-type semiconductor substrate 1 is 625 μm in thickness and doped relatively heavily (e.g. the impurity concentration therein is $4 \times 10^{18}$ cm$^{-3}$ or more). N-type semiconductor substrate 1 exhibits low specific resistivity. N-type silicon layer 2 is 55 μm in thickness and doped relatively lightly (e.g. the impurity concentration therein is $4 \times 10^{15}$ cm$^{-3}$). Silicon oxide film 3 of 0.8 μm in thickness is formed on n-type silicon layer 2 by pyrogenic oxidation at 1150 C.° for 3 hr.

Figure 1B:
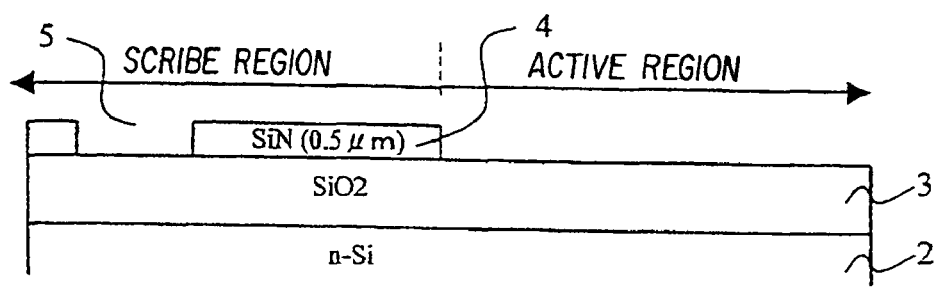
FIG. 1(b) is a cross sectional view describing a manufacturing step subsequent to the step described in FIG. 1(a)

Referring now to FIG. 1(b), silicon nitride film 4 of 0.5 μm in thickness is formed on silicon oxide film 3. A resist film is coated, baked and exposed to light to pattern alignment maker 5 in a scribe region. Silicon nitride film 4 is etched by plasma etching. The resist film is burnt to ashes and peeled off. A marker 5 is formed in silicon nitride film 4 in the scribe region and silicon nitride film 4 outside the scribe region is removed as shown in FIG. 1(b).

Figure 1C:
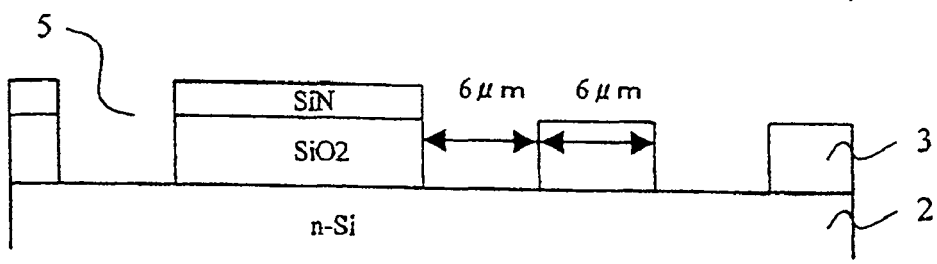
FIG. 1(c) is a cross sectional view describing a manufacturing step subsequent to the step described in FIG. 1(b)

A resist film is coated again and exposed to light. A stripe-shaped surface pattern having stripes of 6 μm in width and spaced apart for 6 μm from each other is formed for forming p-type SJ columns. As shown in FIG. 1(c), openings are formed through silicon oxide film 3 by pattern etching such that a silicon plane is exposed. Then, the resist film is removed.

Figure 1D:
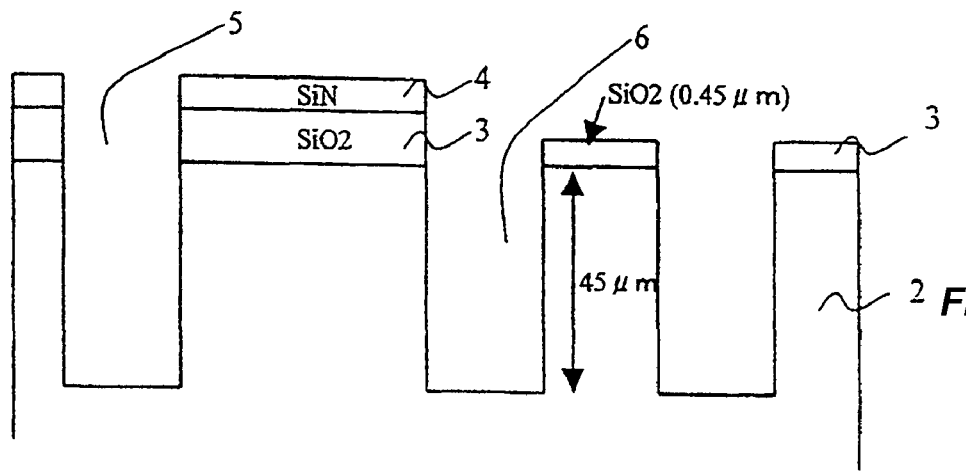
FIG. 1(d) is a cross sectional view describing a manufacturing step subsequent to the step described in FIG. 1(c)

Referring now to FIG. 1(d), trenches 6, 45 μm in depth and having a high aspect ratio, are formed vertically from the openings formed through silicon oxide film 3 with the Si etcher (sulfur hexafluoride SF$_6$) for the Bosch processing method well know to the persons skilled in the art. At the same time, a deep trench marker is formed in alignment marker 5 for positioning in the scribe region. Silicon oxide film 3 used for a mask (hereinafter referred to as "mask oxide film 3") is thinned by the etching from the initial thickness of 0.8 μm to the remaining thickness of 0.45 μm.

Figure 2A:
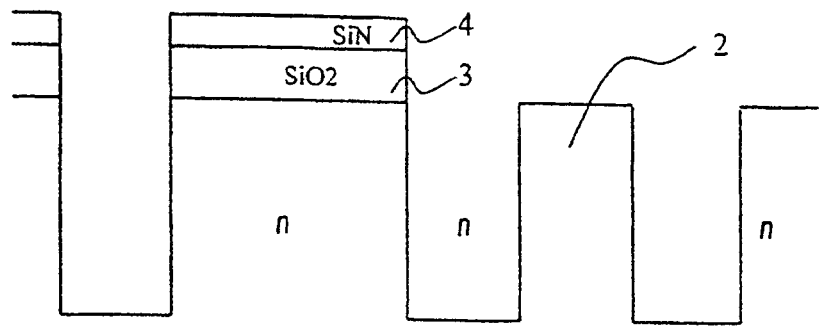
FIG. 2(a) is a cross sectional view describing a manufacturing step subsequent to the step described in FIG. 1(d)

Referring now to FIG. 2(a), mask oxide film 3 outside the scribe region is removed by wet etching using hydrofluoric acid. Mask oxide film 3 covered with silicon nitride film 4 in the scribe region is left unremoved. Although not illustrated, the oxide film on the back surface is also removed by the wet etching.

Figure 2B:
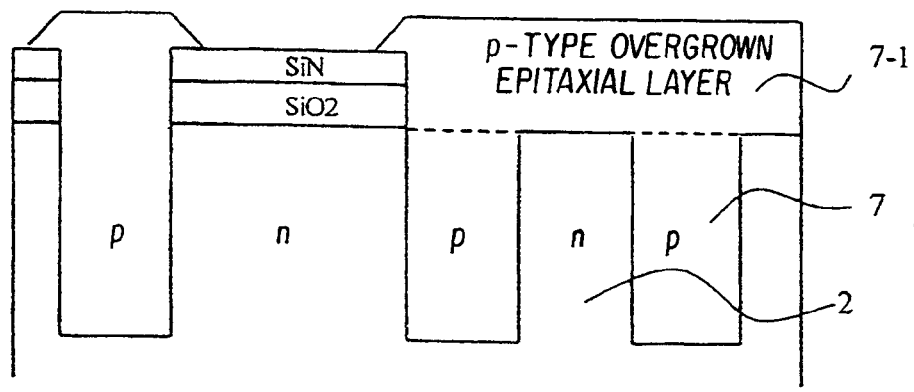
FIG. 2(b) is a cross sectional view describing a manufacturing step subsequent to the step described in FIG. 2(a)

Referring now to FIG. 2(b), p-type silicon layer 7 is buried in trench 6 by epitaxial growth. For guaranteeing that all the trenches 6 are completely filled with p-type silicon layer 7, it is necessary to overgrow p-type silicon layer 7 epitaxially for around 4 μm in average form the wafer surface. Since any mask oxide film is not on the surface of n-type silicon layer 2 in the active region outside the ascribe region anymore, the lateral epitaxial growth onto the oxide film caused by the conventional method does not occur. Since the epitaxial growth is occurring always on the silicon plane uniformly according to the invention, crystal defects are prevented from causing.

Figure 2C:
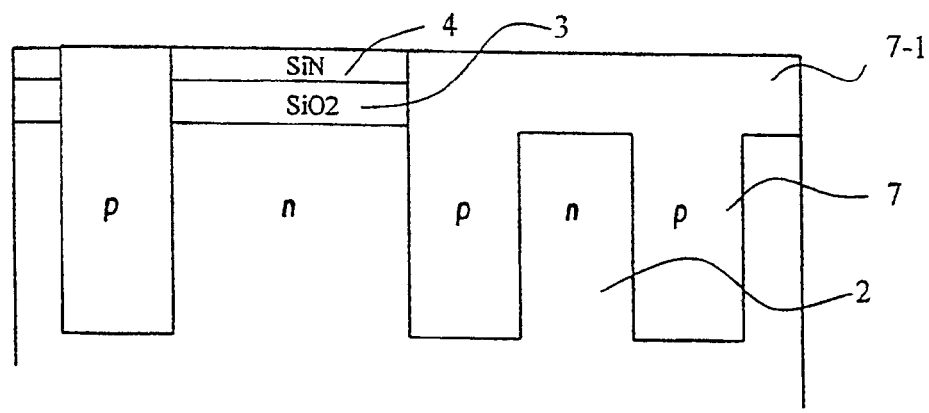
FIG. 2(c) is a cross sectional view describing a manufacturing step subsequent to the step described in FIG. 2(b)

Referring now to FIG. 2(c), p-type overgrown epitaxial layer 7-1 is polished by chemical mechanical polishing (hereinafter referred to as "CMP"). As the polishing proceeds and the polishing pad touches silicon nitride film 4 in the scribe region, the motor current changes due to the motor torque change. The end of polishing is judged based on the motor current change and the polishing is stopped after conducting over polishing a little bit. Since a polished surface is determined with reference to the surface of silicon nitride film 4, it is possible to control the position of the polished surface accurately. Therefore, it is possible to manage the depth of the p-type epitaxial layer filling the trench from the polished surface to the bottom thereof accurately. Therefore, the breakdown voltage variations are reduced.

Figure 2D:
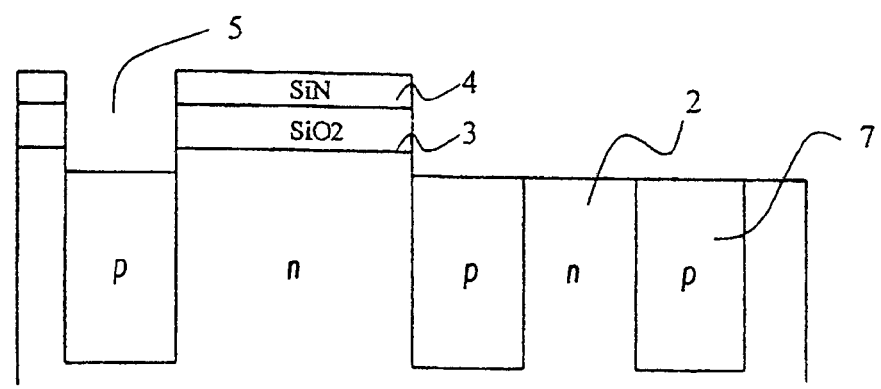
FIG. 2(d) is a cross sectional view describing a manufacturing step subsequent to the step described in FIG. 2(c)

Referring now to FIG. 2(d), p-type overgrown epitaxial layer 7-1 is etched back from the surface thereof for 1.5 µm by the silicon etcher to remove p-type overgrown epitaxial layer 7-1 completely. This etching back treatment is necessary to expose n-type silicon layer 2 to the wafer surface and further to secure a current path. At the same time, a step higher than the active region by 1.5 µm is formed in the scribe region. The scribe region higher than the active region by 1.5 µm is employable for alignment marker 5.

Since the subsequent steps are the same with the steps, through which a MOS device such as a MOSFET having a planar MOS structure is manufactured, the subsequent steps will be described briefly. A field oxide film, which protects the surface of the edge termination surrounding the active region, is formed of a tetra ethyl oxy silicate (hereinafter referred to as a "TEOS") film. The portion of the TEOS film covering the active region that provides a main current path of the device is removed by photo-etching.

Figure 3:
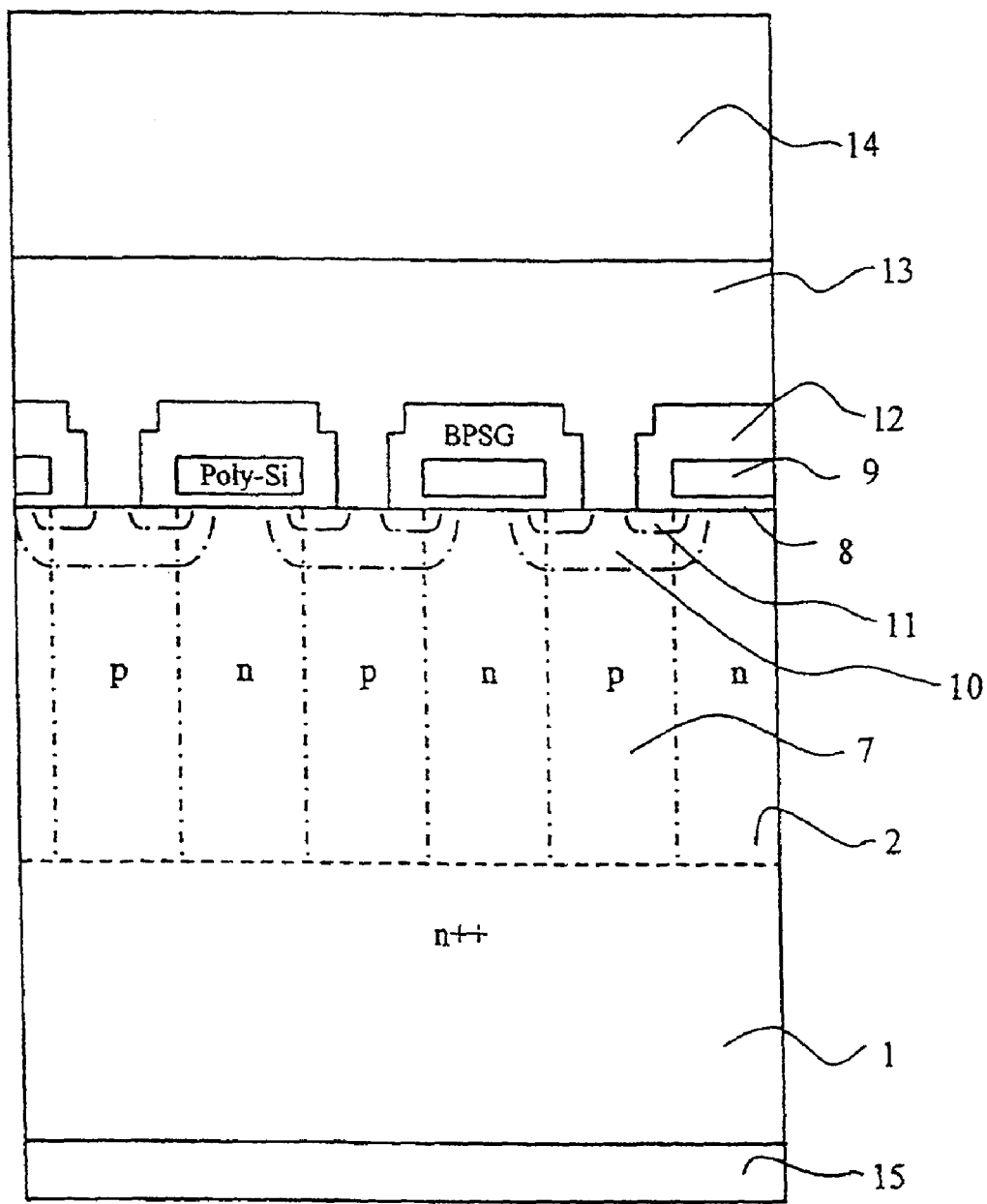
FIG. 3 is a cross sectional view of the SJ-MOSFET of the 600 V class according to the invention.

As shown in FIG. 3, gate oxide film 8 of 1000 Å in thickness is formed at 900 C.°. Polysilicon (polycrystalline silicon) is deposited on gate oxide film 8 for 0.5 µm to form gate electrode 9. Windows are formed through the polysilicon layer by patterning and RIE etching. Gate polysilicon 9 is patterned adjusting to alignment marker 5, boron ions are implanted and the implanted boron atoms are diffused thermally to form p-type base region 10. Thus, p-type column 7 and p-type base region 10 are positioned with each other accurately.

After forming n$^+$-type source region 11, borophospho silicate glass (hereinafter referred to as "BPSG") is grown for 1.1 µm to form interlayer insulator film 12. Contact holes are opened through interlayer insulator film 12 by patterning and etching. Al—Si is deposited for 5 µm to form source surface electrode 13. After patterning the Al—Si film, polyimide surface protection film 14 is formed. The silicon wafer is polished from the back surface side thereof. Back surface drain electrode 15 is formed by depositing Ti, Ni and Au. Thus, the wafer process for manufacturing the SJ-MOSFET, the cross sectional structure thereof is shown in FIG. 3, is completed.

Figure 4:
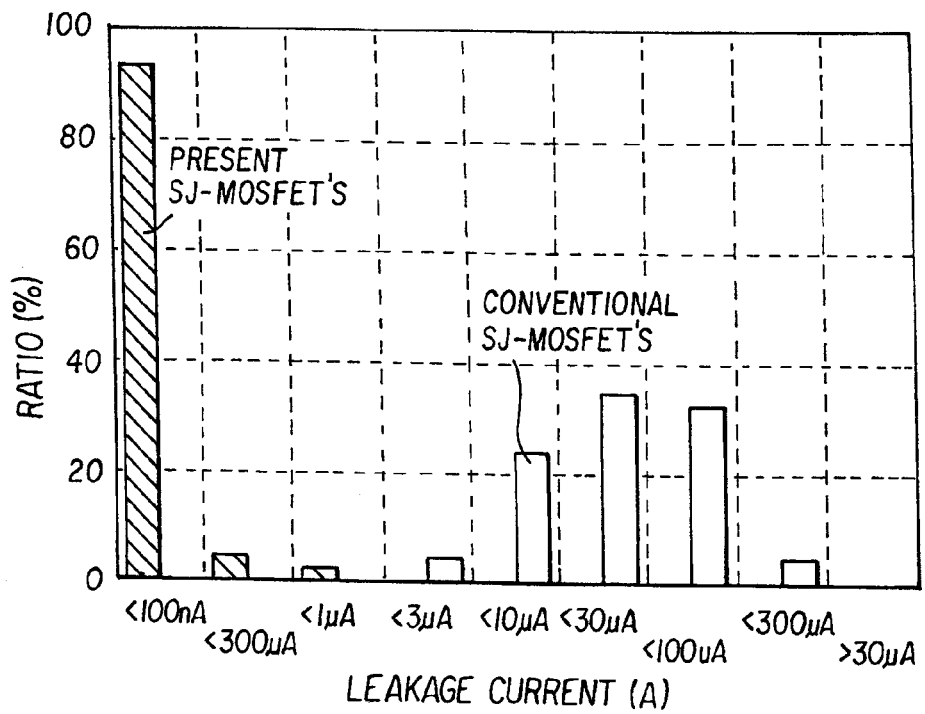
FIG. 4 is a graph comparing the leakage current distributions of the conventional SJ-MOSFET and the SJ-MOSFET according to the invention.

FIG. 4 is a graph comparing the leakage current distributions of the conventional SJ-MOSFET and the SJ-MOSFET according to the invention. In manufacturing the conventional SJ-MOSFET, trenches are filled with a p-type silicon layer grown by epitaxial growth in the state, in which a trench mask oxide film is left unremoved. Crystal defects are caused in the conventional SJ-MOSFET during the over epitaxial growth. FIG. 4 indicates that the peak of the leakage current distribution deviates to large 30 µA due to the crystal defects. FIG. 4 indicates also that crystal defects are prevented from causing during the epitaxial growth by the manufacturing method according to the invention. The peak of the leakage current distribution among the SJ-MOSFET's according to the invention is at 100 nA that is much smaller than the value, at which the leakage current distribution peaks among the conventional SJ-MOSFET's.

Figure 5:
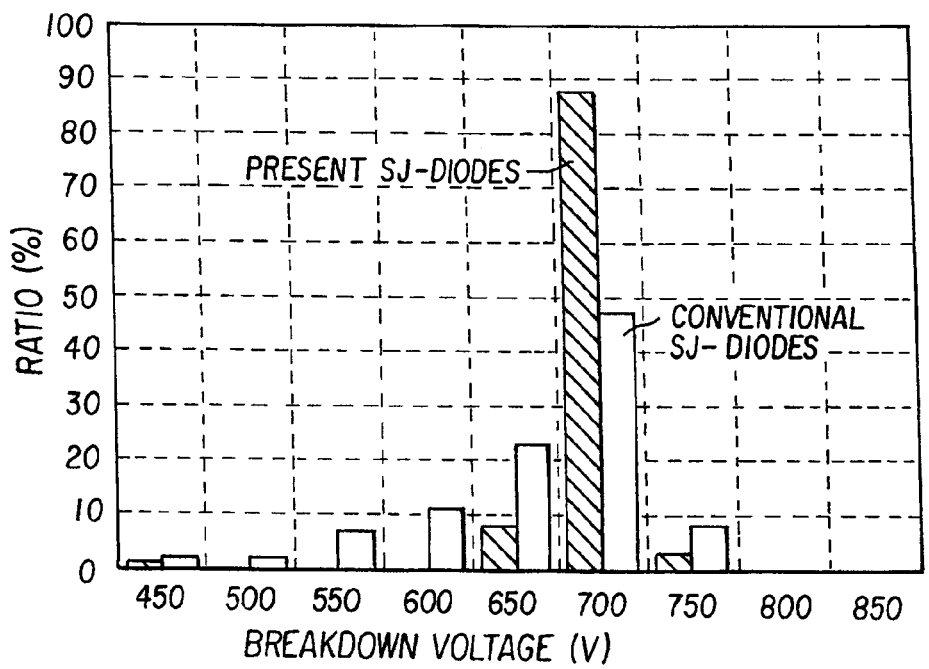
FIG. 5 is a graph comparing the breakdown voltage distributions of the conventional SJ-diode and the SJ-diode according to the invention.
Figure 6:
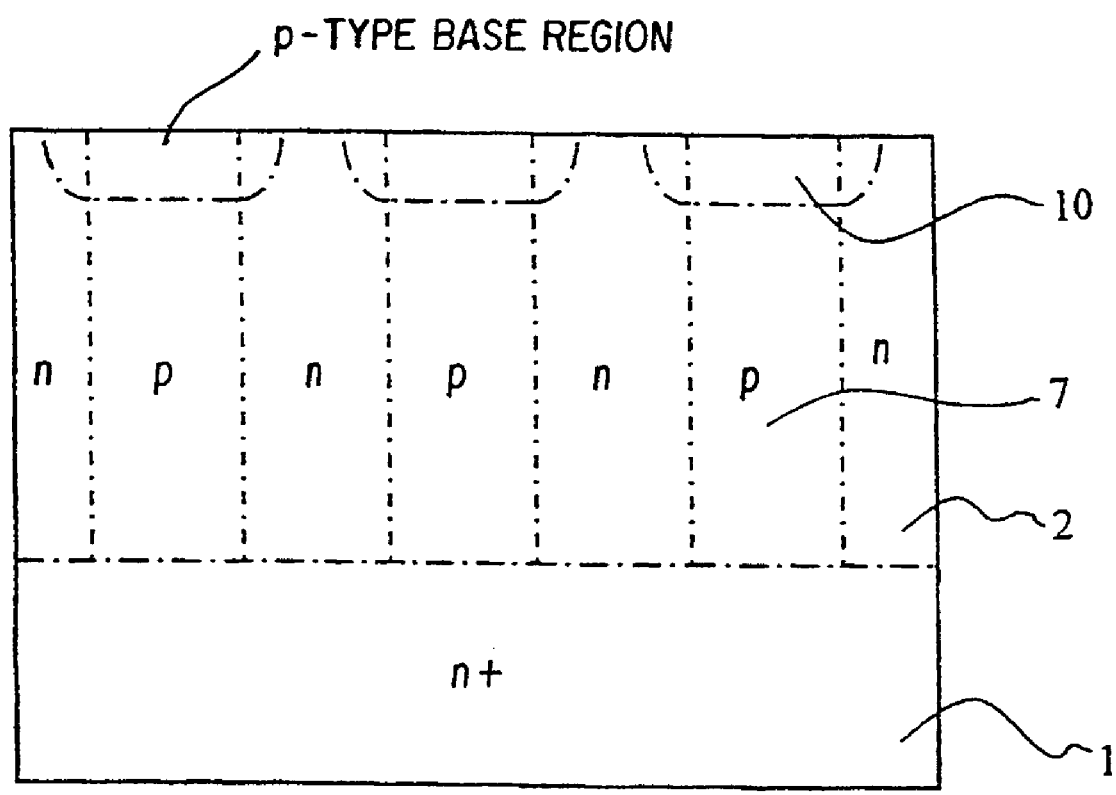
FIG. 6 is a cross sectional view schematically showing a general SJ-MOSFET structure.

FIG. 5 is a graph comparing the breakdown voltage distributions of the conventional SJ-diode and the SJ-diode according to the invention. In manufacturing the SJ-diode according to the invention, the polishing stopper employing the silicon nitride film contributes to improving the accuracy of polishing. Since the depths of the p-type SJ columns are managed with excellent accuracy, the breakdown voltages distribute within a narrow range among the SJ-diodes according to the invention. In other words, the breakdown voltage deviation among the SJ-diodes according to the invention is narrower than the breakdown voltage deviation among the conventional SJ-diodes. Therefore, the throughput of non-defective products is improved.

In the filled-trench-type SJ-MOSFET, the leakage current caused by the crystal defects is reduced according to the invention. Even when the mask oxide film, which is liable to cause crystal defects during the epitaxial growth conducted for filling the trench, is removed, it is possible to form a marker in the scribe region for accurately positioning the p- and n-type columns and the MOS cell structure with each other. Therefore, any hazard is not caused in the subsequent mask positioning (alignment) step. Therefore, the SJ-MOSFET that causes a smaller leakage current is manufactured according to the invention with a high throughput of non-defective products. According to the invention, the overgrown epitaxial layer is removed by the polishing controlled excellently. Thereafter, the thickness of the overgrown epitaxial layer remaining on the wafer surface is controlled excellently. As a result, silicon etching is conducted without causing any over etching nor under etching to further expose the n-type silicon wafer surface accurately. As a result, any deviation is not caused among the depths of the p-type buried layers and deviations are prevented from causing among the breakdown voltages of the devices.

The invention has been described with reference to certain preferred embodiments thereof. It will be understood, however, that modifications and variations are possible within the scope of the appended claims.

This application is based on, and claims priority to, Japanese Patent Application No: 2008-163408, filed on Jun. 23, 2008. The disclosure of the priority application, in its entirety, including the drawings, claims, and the specification thereof, is incorporated herein by reference.

What is claimed is:

1. A method for manufacturing a semiconductor device comprising:
    (a) forming a lightly doped first epitaxial semiconductor layer of a first conductivity type on a first major surface of a heavily doped semiconductor substrate of the first conductivity type;
    (b) forming a first mask film for forming a trench on the first major surface and forming a second mask film, comprising a material different from a material of the first mask film, subsequent to forming the first mask film for forming a super-junction structure in the first epitaxial semiconductor layer, the super-junction structure providing a main current path in an ON-state of the semiconductor device, the super-junction structure being depleted in an OFF-state of the semiconductor device, the super-junction structure comprising a columnar first region of the first conductivity type and a columnar second region of a second conductivity type extending in parallel to the main current path, the columnar first region and the columnar second region being arranged alternately and in adjacent to each other;

(c) selectively removing a portion of the second mask film in a marker region for mask positioning in a scribe region pattern and a portion of the second mask film in a region outside the scribe region pattern;

(d) forming an opening for forming a trench in the first mask film, the trench being necessary for shaping the second region with a column in adjacent to the first region and for arranging the second region and the first region alternately;

(e) forming the trench through the opening by etching using the first mask film for an etching mask, the trench having a high aspect ratio; and (f) removing a portion of the first mask film outside a region covered with the second mask film and burying a second epitaxial semiconductor layer of the second conductivity type in the trench for forming the columnar second region and for further forming the super-junction structure.

2. The method according to claim 1, wherein the first mask film comprises a silicon oxide film.

3. The method according to claim 1, wherein the second mask film comprises a silicon nitride film.

4. The method according to claim 1, wherein the trench having a high aspect ratio is formed through a Bosch process or by reactive ion etching using inductively coupled plasma.

5. The method according to claim 1, wherein the trench having a high aspect ratio is formed by reactive ion etching using inductively coupled plasma.

6. The method according to claim 1, wherein the second epitaxial semiconductor layer is buried in the trench such that the trench is filled with the second epitaxial semiconductor layer and, then, the second epitaxial semiconductor layer is chipped for exposing a surface of the first region.

7. The method according to claim 6, wherein a torque variation of a polishing motor caused by a contact of a polishing pad to the second mask film is detected in exposing the surface of the first region for judging an end of a polishing treatment; and a surface portion of the second epitaxial semiconductor layer is etched for exposing the surface of the first region.

* * * * *